(12) United States Patent
Chou

(10) Patent No.: US 7,416,919 B2
(45) Date of Patent: Aug. 26, 2008

(54) METHOD FOR WAFER LEVEL STACK DIE PLACEMENT

(75) Inventor: Hui-Lung Chou, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 447 days.

(21) Appl. No.: 11/263,974

(22) Filed: Nov. 2, 2005

(65) Prior Publication Data
US 2006/0099735 A1 May 11, 2006

(30) Foreign Application Priority Data
Nov. 3, 2004 (TW) .............................. 93133483 A

(51) Int. Cl.
*H01L 21/00* (2006.01)
(52) U.S. Cl. .............................. 438/107; 257/E21.517; 257/E21.599

(58) Field of Classification Search ................. 438/107, 438/108, 118
See application file for complete search history.

(56) References Cited

U.S. PATENT DOCUMENTS
6,258,626 B1   7/2001   Wang et al.

FOREIGN PATENT DOCUMENTS
TW          444364        7/2001

*Primary Examiner*—W. David Coleman
(74) *Attorney, Agent, or Firm*—Volentine & Whitt, P.L.L.C.

(57) ABSTRACT

A method for wafer level stack die placement is disclosed. At first, a wafer including a plurality of dice is provided. The wafer is adhered to a photosensitive adhesive tape. The wafer is attached on a die carrier to fix at least one die from the wafer on the die carrier. The die carrier may be another wafer. The photosensitive adhesive tape is selectively exposed to form an adhesion-released portion. The adhesion-released portion is aligned with the fixed die. Then, the photosensitive adhesive tape and the die carrier with the fixed die are apart. Therefore the stack die placement in the die-attaching batch is quick and efficient.

19 Claims, 6 Drawing Sheets

METHOD FOR WAFER LEVEL STACK DIE PLACEMENT

BACKGROUND OF THE INVENTION

1. Field of the Invention

The present invention relates to a method for stack die placement, and more particularly to a method for wafer level stack die placement.

2. Description of the Related Art

In a multi-chip package, a plurality of dice may be stacked on a die carrier to achieve a package of high density. A conventional stacking way is picking and placing the individual die, which has a low efficiency in the stack die placement. Furthermore, the electrical connection for stacking dice is provided by flip-chip bonding or wire bonding. When a wire bond die is stacked on a flip-chip die, an adhesive will be formed on a non-active surface of the flip-chip die in advance to facilitate the adhesive fixation of the wire bond die which is stacked above.

The conventional method for stack die placement is to cut a wafer into a plurality of dice firstly, and then pick and place them individually, one by one, to perform the stack die placement. Referring to FIG. 1A, a wafer 110 comprising a plurality of dice 111 is provided at first. Referring to FIG. 1B, the wafer 110 is adhered to a cutting tape 120, on which the wafer 110 is cut to form the dice 111 in the form of a wire bond. Referring to FIG. 1C, a plurality of flip-chip dice 130 are provided subsequently, which are bonded to a substrate 140 to serve as a die carrier when stacking the dice 111. Then, a thermoset adhesive 150 is formed on a non-active surface 131 of the flip-chip dice 130. Referring to FIG. 1D, then the substrate 140 is transported into a pick & place machine together with the flip-chip dice 130, and a pick & place arm (not shown) is moved to pick up the active surface 112 of the dice 111, wherein the dice 111 are placed on the corresponding flip-chip dice 130 in a back-to-back way individually. Referring to FIG. 1E, the thermoset adhesive 150 is heated to adhere the non-active surfaces 113 of the dice 111 and the non-active surfaces 131 of the flip-chip dice 130. In the conventional method for stack die placement, the dice are picked and placed on the flip-chip dice 130 one by one by the pick & place arm after the wafer 110 is cut, so that the conventional method for stack die placement is time consuming and its stacking efficiency is rather low.

A similar method for stack die placement is disclosed in ROC (Taiwan) Patent Publication No. 444364 entitled "Method for Manufacturing Stacked Chip Package Structure", which comprises a die-attaching process on the dice, wherein the back of a second chip is adhered on a first chip by an adhesive layer, and then an underfill is formed between the first chip and the substrate. Therefore, in the method for manufacturing the stacked chip package structure described above, individual stacking should be carried out on the singulated chip. When the stack-type multi-chip package structures are mass-produced, the second chips only can be stacked to the backs of the first chip by picking and placing one by one.

Consequently, there is an existing need for a method for wafer level stack die placement to solve the above-mentioned problems.

SUMMARY OF THE INVENTION

The object of the present invention is to provide a method for wafer level stack die placement. A surface of a wafer is adhered to a photosensitive adhesive tape. The wafer is attached to a die carrier after the wafer is cut. Then the photosensitive adhesive tape is selectively exposed to form an adhesion-released portion, such that the die of the wafer may be detached from the photosensitive adhesive tape and fixed on the die carrier, thus completing wafer level stack die placement quickly and increasing the number of units per hour (UPH).

Another object of the present invention is to provide a method for wafer level stack die placement. The step of attaching a wafer to a plurality of die carriers and the step of adjusting the location of a mask and exposing a photosensitive adhesive tape are repeated, such that a plurality of dice of the wafer are fixed on a plurality of different die carriers in batches, thus stacking the dice on the die carriers rapidly, reducing the time of the conventional process of picking and placing dice on the corresponding die carrier one by one by a pick & place machine, and speeding up the cycle time of product.

Still another object of the present invention is to provide a method for wafer level stack die placement. A die carrier comprises a plurality of second dice. The size of the second dice is the same as or in an integral multiple of that of a plurality of first dice of a wafer. The die carrier is another wafer of the same size as the wafer. The first dice may be fixed on the second dice in batches, and particularly applied in the back-to-back dual-wafer die-attaching process of the wafer in flip-chip form and wire bond form to achieve a fast stack die placement.

According to the method for wafer level stack die placement of the present invention, a wafer is provided at first, which has a first surface and a corresponding second surface and comprises a plurality of the first dice; and subsequently, the first surface of the wafer is adhered to a photosensitive adhesive tape, and the second surface of the wafer is attached to a die carrier, so that at least one of the first dice is fixed on the die carrier; and then, the photosensitive adhesive tape is selectively exposed, aligning with the fixed first die to form an adhesion-released portion; and finally, the photosensitive adhesive tape and the die carrier with the fixed first die are apart. Therefore, these first dice can be detached from the photosensitive adhesive tape in batches, and then fixed on the die carrier.

DETAILED DESCRIPTION OF THE INVENTION

The present invention will be illustrated in the following embodiments with reference to the accompanying drawings.

Figure 1A:
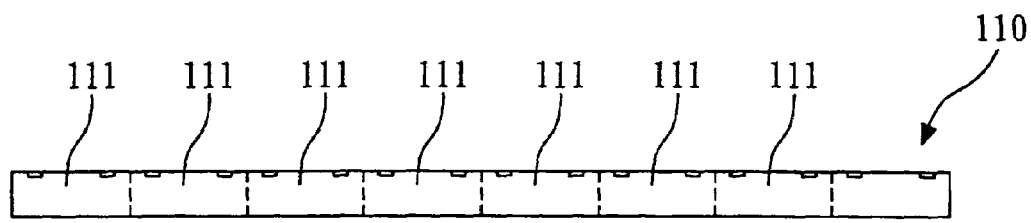
FIGS. 1A to 1E are schematic sectional views of a plurality of first dice in the stacking process from wafer cutting to die attaching according to a conventional method for stack die placement.
Figure 1B:
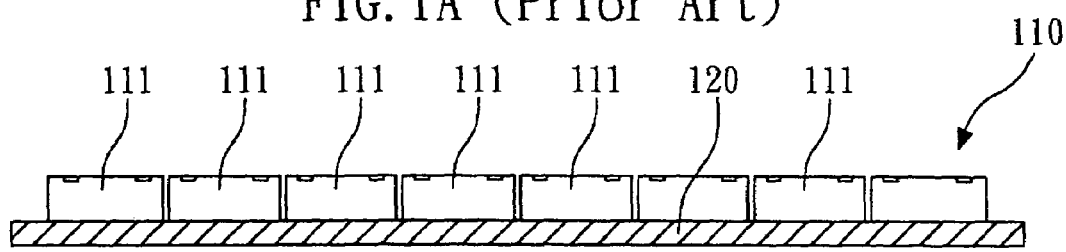
Figure 1C:
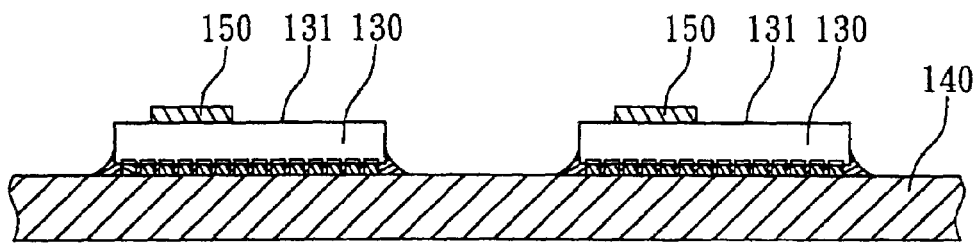
Figure 1D:
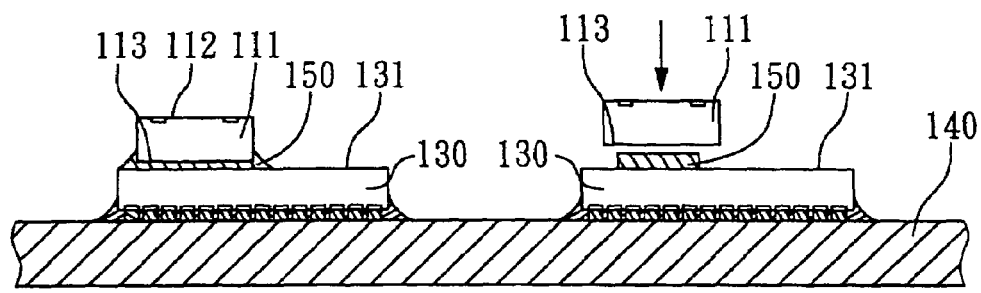
Figure 1E:
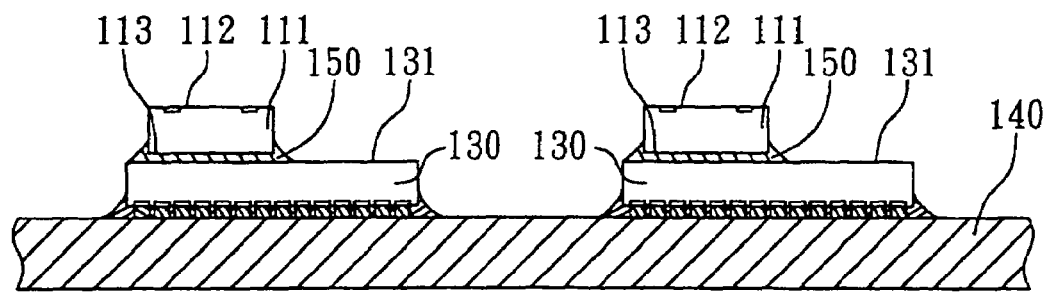
Figure 2A:
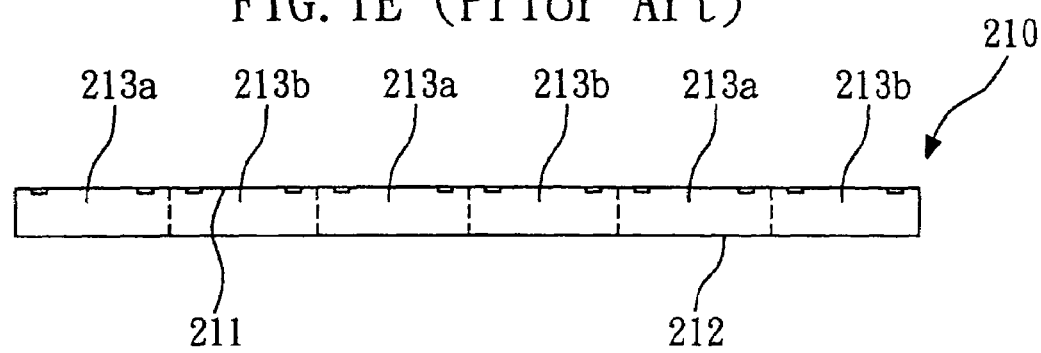
FIGS. 2A to 2K are schematic sectional views of a plurality of first dice in the stacking process from wafer cutting to die attaching in an embodiment according to the method for wafer level stack die placement of the present invention.

Referring to FIGS. 2A to 2K, a method according to an embodiment of the present invention is shown. Referring to FIG. 2A, a first wafer 210 is provided. The first wafer 210 has a first surface 211 and a corresponding second surface 212 and comprises a plurality of first dice. These first dice are divided into a plurality of die-attaching batches. In the present embodiment, these first dice of the first die-attaching batch are represented by the numeral 213a, and the first dice of the second die-attaching batch are represented by the numeral 213b.

Figure 2B:
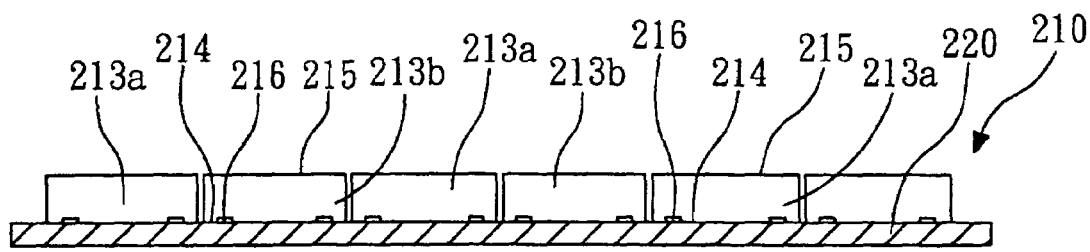

Referring to FIG. 2B, the first surface 211 (FIG. 2A) of the first wafer 210 is adhered to a photosensitive adhesive tape 220. In the present embodiment, the photosensitive adhesive tape 220 is a cutting tape, such as the common blue UV tape. On the photosensitive adhesive tape 220, the first wafer 210 is cut to form a plurality of the first dice 213a and 213b, and each first die 213a and 213b has an active surface 214 and a corresponding non-active surface 215; that is, the first surface 211 of the first wafer 210 is the active surfaces 214 of the first dice 213a and 213b, and the second surface 212 of the first wafer 210 is the non-active surfaces 215 of the first dice 213a and 213b. In the present embodiment, the active surfaces 214 of the first dice 213a and 213b are adhered to the photosensitive adhesive tape 220. The first dice 213a and 213b may be wire bond dice. These active surfaces 214 are formed with a trace structure (not shown) and a plurality of bonding pads 216 for wire bonding.

Figure 2C:
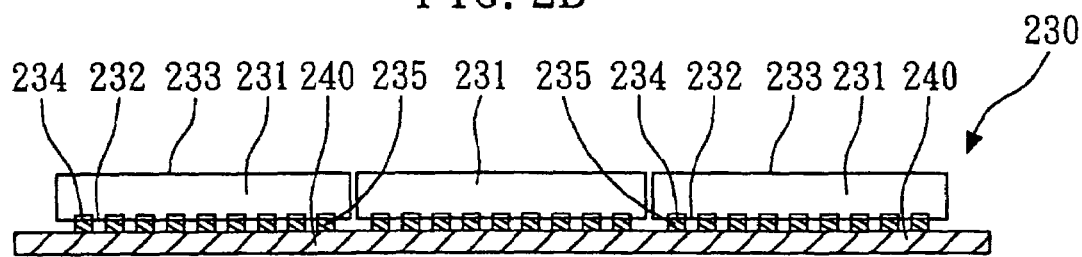

Referring to FIG. 2C, a second wafer 230 is provided as a die carrier when stacking these first dice 213. Alternatively, the die carrier may be a printed circuit board, a ceramic circuit board or a lead frame. The second wafer 230 comprises a plurality of second dice 231, and each second die 231 has an active surface 232, a non-active surface 233 and a plurality of bonding pads 234 formed on the active surfaces 232. In the embodiment, the second dice 231 are in flip-chip form, and a plurality of bumps 235 are formed on the bonding pads 234. The second dice 231 may be singulated after the second wafer 230 is cut. In the embodiment, a cutting tape 240 is adhered to the second dice 231, and the non-active surfaces 233 of the second dice 231 are exposed. The material of the cutting tape 240 may be the same as or different from that of the photosensitive adhesive tape 220. Preferably, the size of the second wafer 230 may be the same as the size of the first wafer 210, and the size of the second dice 231 may be the same as or in an integral multiple of the size of the first dice 213a and 213b of the first wafer 210 for stacking at least one of the first dice 213a and 213b. Preferably, the number of the first dice 213a and 213b of the first wafer 210 is an integral multiple of the second dice 231 of the second wafer 230, such that in the method for wafer level stack die placement, the first wafer 210 and the second wafer 230 with corresponding numbers are provided simultaneously, thus shortening the process cycle of stacking the first dice 213a and 213b of the first wafer 210 on the second dice 231 of the second wafers 230. In the embodiment, the number of the first dice 213a and 213b of the first wafer 210 doubles the number of the second dice 231 of the second wafer 230. In the embodiment, two second wafers 230 are provided.

Figure 2D:
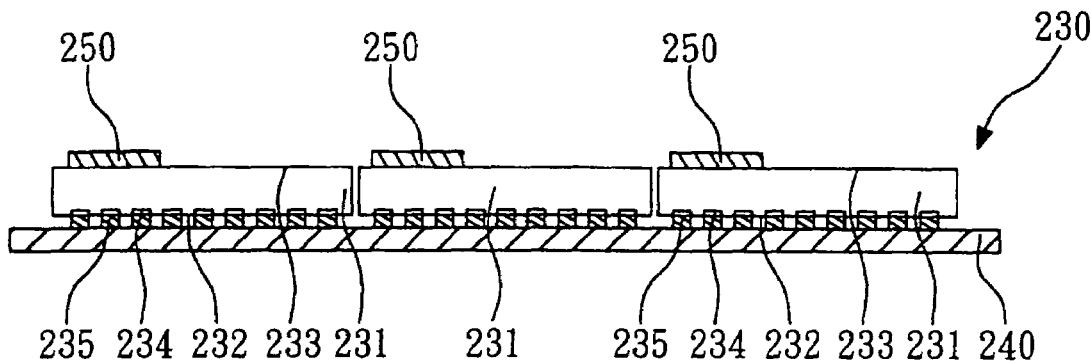

Referring to FIG. 2D, an adhesive 250 is formed on one of the second wafers 230. The adhesive 250 is located at the predetermined locations of the non-active surfaces 233 of the second dice 231. The adhesive 250 may be a silver paste, a non-conductive resin or a tape. In the present embodiment, the adhesive 250 is thermoset.

Figure 2E:
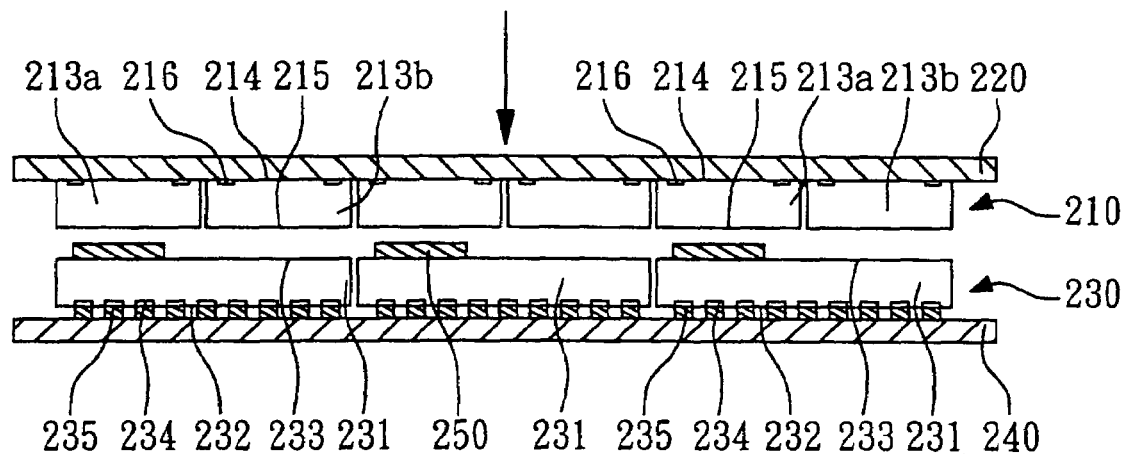

Referring to FIG. 2E, the photosensitive adhesive tape 220 and the first wafer 210 are moved above the second wafer 230 such that the first dice 213a of the first die-attaching batch are aligned with the second dice 231.

Figure 2F:
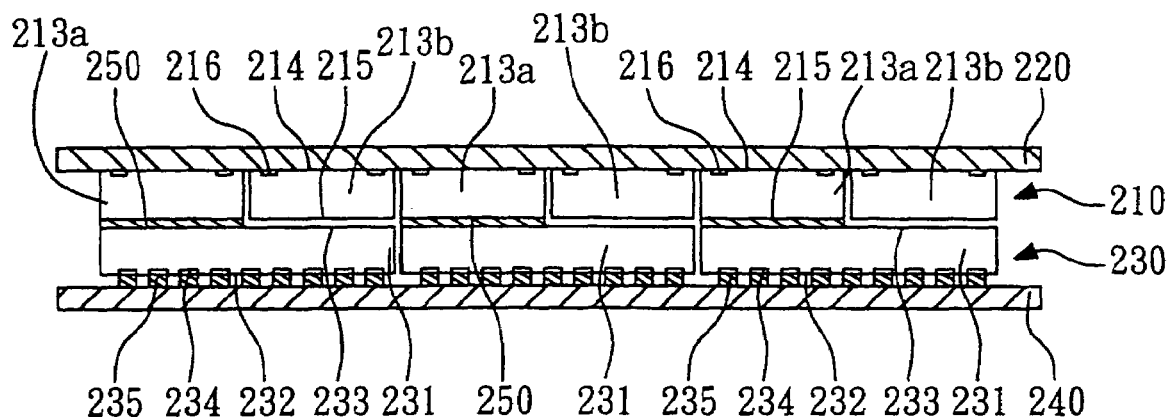

Referring to FIG. 2F, the first wafer 210 is attached to the second wafer 230, such that the first dice 213a of the first die-attaching batch are fixed on the second dice 231 by the adhesive 250. The adhesive 250 may be heated and cured through a pre-baking step, so that the first dice 213a are fixed on the second dice 231 in a back-to-back way.

Figure 2G:
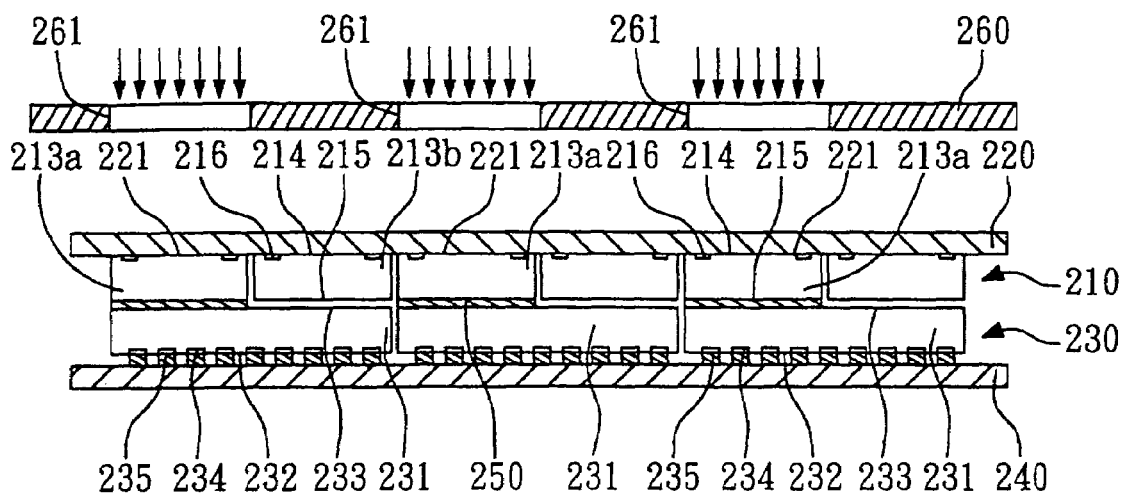

Referring to FIG. 2G, corresponding to the fixed first dice 213a, the photosensitive adhesive tape 220 is selectively exposed. In the present embodiment, a mask 260 is used in the step of selective exposure. The mask 260 is movable to align a plurality of light holes 261 with the fixed first dice 213a. An exposure light source, such as UV light, irradiates the photosensitive adhesive tape 220 through the light holes 261, so that a plurality of adhesion-released portions 221 are formed. Preferably, the size of the light holes 261 corresponds to the size of the fixed first dice 213a to form the adhesion-released portions 221 of an appropriate size.

Figure 2H:
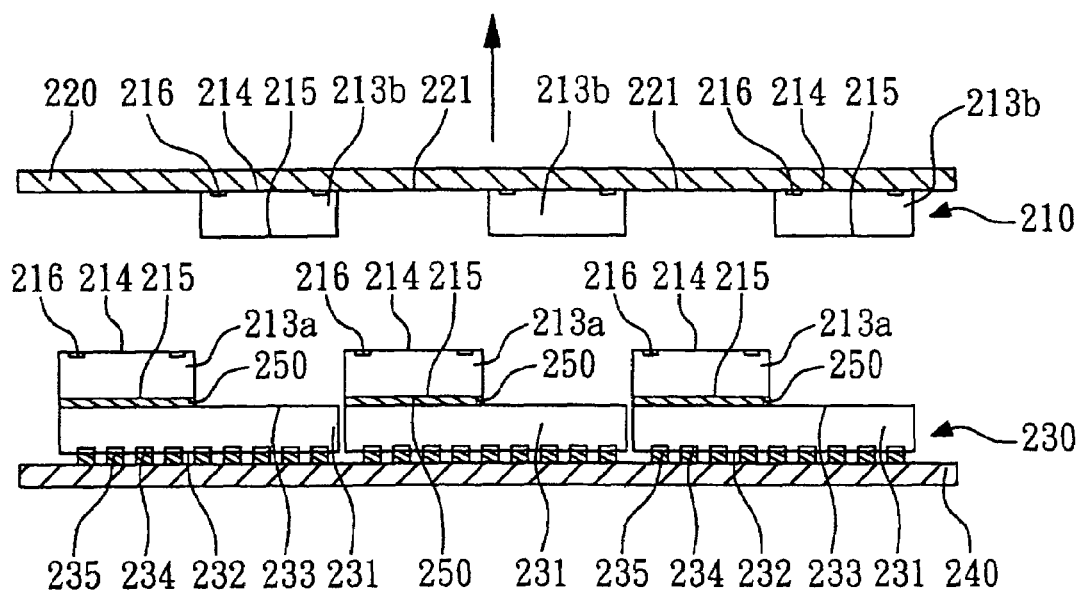

Referring to FIG. 2H, the photosensitive adhesive tape 220 and the second wafer 230 with the fixed first dice 213 of the first die-attaching batch are apart. Thus, the first dice 213a of the first die-attaching batch in the first wafer 210 are detached from the photosensitive adhesive tape 220 and then fixed on the second dice 231. Additionally, the first dice 213b of the second die-attaching batch or the others are still adhered on the photosensitive adhesive tape 220.

Figure 2I:
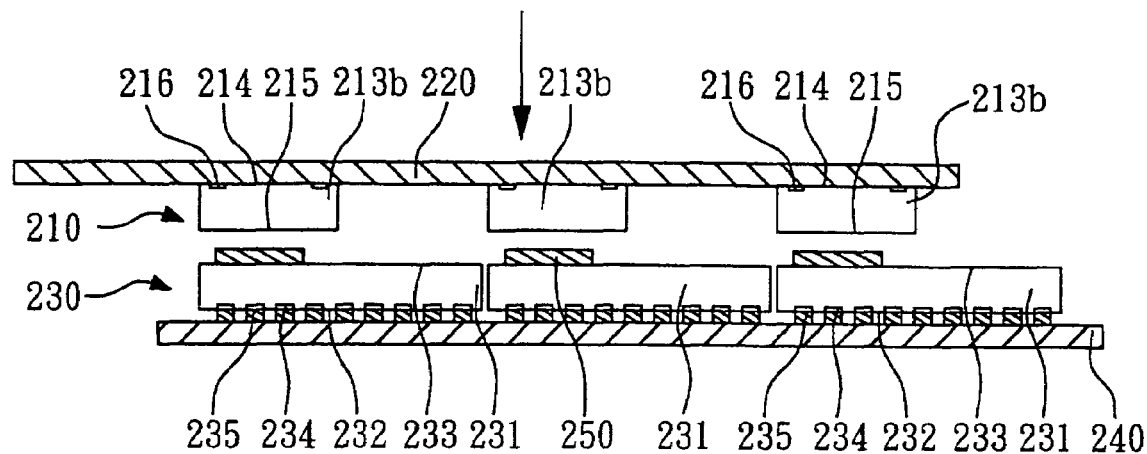

Referring to FIG. 2I, in the present embodiment, the first wafer 210 is moved above another second wafer 230 to repeat the step of attaching the first wafer 210 and the step of exposure described above, such that the first dice 213b of the second die-attaching batch or other dice in the first wafer 210 may be fixed on the second dice 231 of the second wafer 230.

Referring to FIG. 2I again, the adhesive 250 is formed on the non-active surfaces 233 of the second dice 231. The photosensitive adhesive tape 220 and the first wafer 210 are moved above another second wafer 230 such that the first dice 213b of the second die-attaching batch are aligned with the second dice 231. Then, the first wafer 210 is attached to the second wafer 230, and fixed on the second dice 231 by the adhesive 250. The adhesive 250 may be heated and cured through a pre-baking step, such that the first dice 213 are fixed on the second dice 231 in a back-to-back way in batches.

Figure 2J:
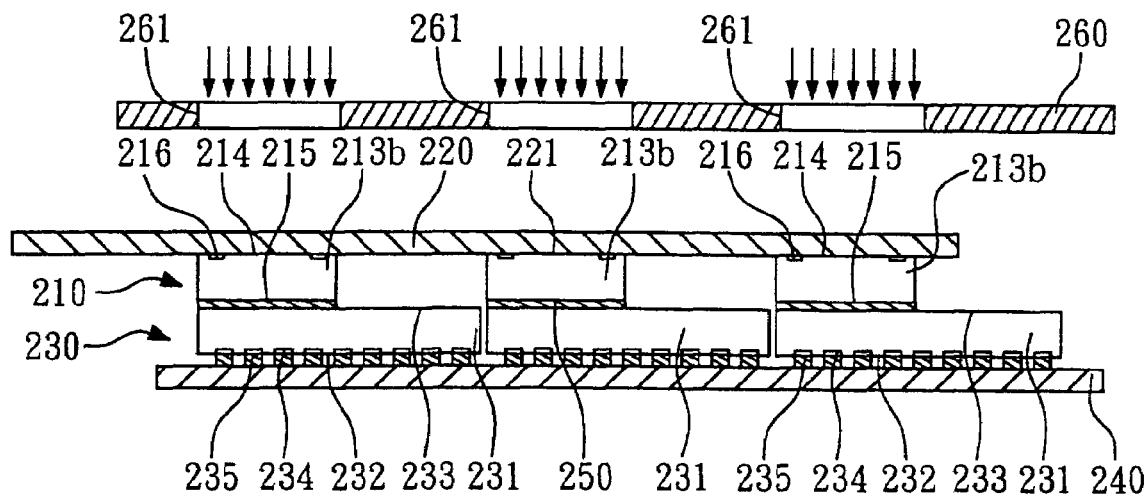

Referring to FIG. 2J, the mask 260 is moved, and its light holes 261 are aligned with the portion of the photosensitive adhesive tape 220 which is adhered with, for example, the first dice 213b of the second die-attaching batch or the others. An exposure light source irradiates to the photosensitive adhesive tape 220 through the light holes 261, so that another adhesion-released portion is formed to facilitate the detachment of the first dice 213b of the second die-attaching batch.

Figure 2K:
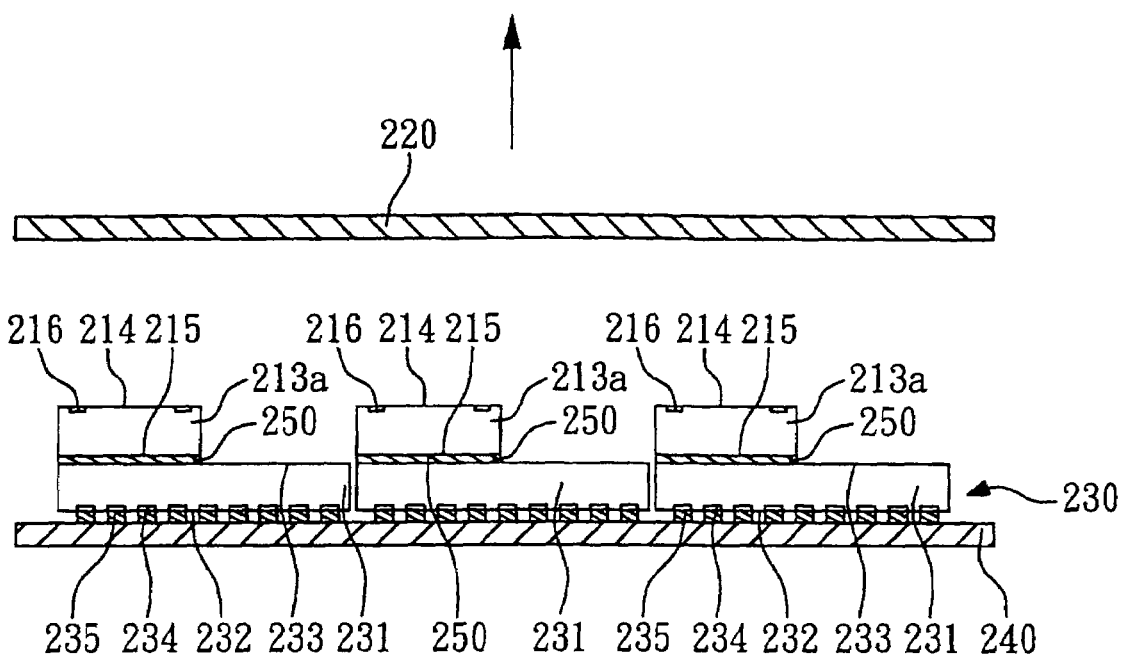

Referring to FIG. 2K, the photosensitive adhesive tape 220 and the second wafer 230 with the fixed first dice 213b of the second die-attaching batch are apart. Therefore, the first dice 213b of the second die-attaching batch in the first wafer 210 are detached from the photosensitive adhesive tape 220 and then fixed on the second die 231.

In the method for wafer level stack die placement described above, the first surface 211 of the first wafer 210 is adhered to the photosensitive adhesive tape 220; the adhesion-released portions 221 are formed when the light source irradiates to facilitate the detachment of the first dice 213 of the first wafer 210 from the photosensitive adhesive tape 220 and the fixation on the second dice 231 of the second wafers 230 in batches. It can increase the number of UPH, eliminate the process time of picking and placing the first dice on the corresponding die carrier one by one by the conventional pick & place machine, and speed up the cycle time of the product.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A method for wafer level stack die placement, comprising:
   providing a wafer having a first surface, a corresponding second surface and a plurality of first dice;
   adhering the first surface of the wafer to a photosensitive adhesive tape;
   attaching the second surface of the wafer to a die carrier such that at least one of the first dice is fixed on the die carrier;
   selectively exposing the photosensitive adhesive tape aligning with the fixed first die to form an adhesion-released portion; and
   separating the photosensitive adhesive tape and the die carrier with the fixed first die.

2. The method for wafer level stack die placement according to claim 1, wherein the step of attaching the wafer and the exposing step are repeated, such that the first dice of the wafer are fixed on different die carriers in batches.

3. The method for wafer level stack die placement according to claim 1, wherein a mask is used in the exposing step, and the mask has a light hole, with its size corresponding to that of the fixed first die for forming the adhesion-released portion.

4. The method for wafer level stack die placement according to claim 1, wherein an exposure light source used in the exposing step is UV light.

5. The method for wafer level stack die placement according to claim 1, further comprising a step of cutting the wafer, wherein the wafer is cut into the first dice on the photosensitive adhesive tape.

6. The method for wafer level stack die placement according to claim 1, wherein an adhesive is provided between the wafer and the die carrier to fix the first die.

7. The method for wafer level stack die placement according to claim 1, wherein the die carrier is selected from a group consisting of wafer, printed circuit board, ceramic circuit board and lead frame.

8. The method for wafer level stack die placement according to claim 1, wherein the die carrier is a cut wafer comprising a plurality of second dice.

9. The method for wafer level stack die placement according to claim 3, wherein the locations of the mask and the wafer are adjusted when repeating the exposing step.

10. The method for wafer level stack die placement according to claim 6, further comprising a step of curing the adhesive before the exposing step.

11. A method for dual-wafer die attachment, comprising:
    providing a first wafer having a first surface, a corresponding second surface and a plurality of first dice, the first dice divided into a plurality of die-attaching batches;
    providing a second wafer having a plurality of second dice;
    adhering the first surface of the first wafer to a photosensitive adhesive tape;
    attaching the second surface of the first wafer to the second wafer to fix the first dice of one of the die-attaching batches on the second dice of the second wafer;
    exposing the photosensitive adhesive tape to form an adhesion-released portion aligning with the fixed first dice; and
    separating the photosensitive adhesive tape and the second wafer with the fixed first dice of the die-attaching batch.

12. The method for dual-wafer die attachment according to claim 11, wherein the step of attaching the first wafer and the exposing step are repeated, such that the first dice of the other die-attaching batches of the first wafer are fixed on different second wafers in batches respectively.

13. The method for dual-wafer die attachment according to claim 11, wherein a mask is used in the exposing step, and the mask has a plurality of light holes with a size corresponding to that of the fixed first dice for forming the adhesion-released portions.

14. The method for dual-wafer die attachment according to claim 11, wherein an exposure light source used in the exposing step is UV light.

15. The method for dual-wafer die attachment according to claim 11, further comprising a step of cutting the first wafer, wherein the first wafer is cut into the first dice on the photosensitive adhesive tape.

16. The method for dual-wafer die attachment according to claim 11, wherein an adhesive is formed between the first wafer and the second wafer to fix the first dice.

17. The method for dual-wafer die attachment according to claim 13, wherein the locations of the mask and the first wafer are adjusted when the step of exposure is repeated.

18. The method for dual-wafer die attachment according to claim 15, wherein the first surface of the first wafer after being cut is the active surfaces of the first dice.

19. The method for dual-wafer die attachment according to claim 16, further comprising a step of curing the adhesive before the exposing step.

* * * * *